United States Patent [19]

Gesche et al.

[11] Patent Number: 5,397,448

[45] Date of Patent: Mar. 14, 1995

[54] DEVICE FOR GENERATING A PLASMA BY MEANS OF CATHODE SPUTTERING AND MICROWAVE-IRRADIATION

[75] Inventors: Roland Gesche, Seligenstadt; Rudolf Latz, Rodgau, both of Germany

[73] Assignee: Leybold Aktiengesellschaft, Hanau, Germany

[21] Appl. No.: 108,081

[22] Filed: Aug. 17, 1993

[30] Foreign Application Priority Data

Sep. 10, 1992 [DE] Germany .................. 42 30 290.0

[51] Int. Cl.$^6$ .............................................. C23C 14/34
[52] U.S. Cl. ................. 204/298.16; 204/298.07; 204/298.19
[58] Field of Search ............. 204/192.12, 298.16, 204/298.19, 298.07

[56] References Cited

U.S. PATENT DOCUMENTS

| | | | |
|---|---|---|---|
| 4,610,770 | 9/1986 | Saito et al. | 204/192.1 |
| 4,721,553 | 1/1988 | Saito et al. | 204/192.12 |
| 5,230,784 | 7/1993 | Yoshida | 204/298.19 |

FOREIGN PATENT DOCUMENTS

| | | | |
|---|---|---|---|
| 3500328 | 7/1986 | Germany | 204/192.12 |
| 3920834 | 2/1991 | Germany | 204/298.16 |
| 3-253561 | 11/1991 | Japan | 204/298.16 |

OTHER PUBLICATIONS

Yoshida, YHoshikazu: "Microwave-enhanced magnetron sputtering." *Rev. Sci. Instrum.* 63(1), Jan. 1992, pp. 179–183.

Matsuoka, Morito, et al.: "Unbalanced potential discharge characteristics for opposed-targets sputtering system". *J. Vac. Sci. Technol.* A5(1), Jan./Feb. 11987, pp. 52–56.

M Michiyori et al. "Formation on CoNbZr films by a dc opposing-target sputtering method." *Appl. Phys. Lett.* 49(14), 6 Oct. 1986, pp. 901–902.

Nakagawa, Yashuhiko, et al. "New Piezoelectric $Ta_2O_5$ thin films," *Appl. Phys. Lett,* 46(2), 15 Jan. 1985, pp. 139–140.

Takahashi, Takakazu et al: "High Rate and Low Temperature Disposition of Co-Cr Films by Exposed Pole Magnetron Co-Sputtering System." *Jap. J. Appl. Phys.*, vol. 24, (1985) S.L752–L754.

JP 62-151561 A,: Patents Abstracts of Japan, C-464, Dec. 12, 1987, vol. 11, No. 381.

Primary Examiner—Aaron Weisstuch
Attorney, Agent, or Firm—Felfe & Lynch

[57] ABSTRACT

The invention relates to a device for generating a plasma by means of cathode sputtering and microwave irradiation. This device comprises a magnetron cathode over which is placed a microwave cavity resonator at the atmosphere side. At the vacuum side the device comprises laterally delimiting shielding sheets which on their inside are provided with a magnet which generates a magnetic field perpendicular to the surface of the target of the magnetron cathode.

9 Claims, 2 Drawing Sheets

DEVICE FOR GENERATING A PLASMA BY MEANS OF CATHODE SPUTTERING AND MICROWAVE-IRRADIATION

BACKGROUND OF THE INVENTION

Numerous fields of technology require that thin layers are applied on substrates. For example, glass panes are coated in order to provide them with special properties or watch cases comprising a less noble material are coated with a layer comprising a noble material.

Numerous processes for the application of thin layers on substrates have already been suggested, of which only electroplating and plasma coating will be mentioned. Plasma coating has gained increasing importance because this process permits a multiplicity of materials as coating material.

In order to generate a plasma suitable for coating, various processes have also been suggested. Of great interest among these processes is the cathode sputtering process because of its high coating rates. The coating rates can still be increased further if microwaves are irradiated into the volume in front of the sputtered cathode.

Several devices for microwave-enhanced sputtering are already known (U.S. Pat. Nos. 4,610,770 and 4,721,553; and DE-A-3 920 834). In these devices the microwaves are introduced into the plasma region either parallel or perpendicularly or at a given angle to the substrate surface. Through the cooperation of the magnetic field of the magnetron with the microwaves an electron cyclotron resonance (ECR) effect can be established, which increases the ionization of the plasma particles.

Of disadvantage in most of the known devices is, however, that the ECR condition occurs in the proximity of the sputter cathode where excitation of the particles is not as necessary as in the region of the substrate. In order to remedy this disadvantage in the device according to DE-A-3 920 834, the microwaves are radiated onto a substrate which, in turn, is penetrated by the field lines of a permanent magnet. Hereby the ECR condition is fulfilled directly above the substrate. However, in this known device, a plasma discharge can only occur up to a given minimum voltage and up to a given minimum pressure. Even with very strong magnetic fields on the target surface, the plasma ignition voltage cannot be lowered further. High discharge voltages, however, lead to undesirable effects, such as the inclusion of noble gases in the substrate structure, or to radiation damages.

In order to further lower the plasma ignition voltage, a waveguide with which microwave energy is guided to a target surface, is positioned within the vacuum chamber at the lateral edge of the target. The ionization of the plasma is hereby considerably increased so that it becomes possible to sputter at a low discharge voltage and at high current. Discharge voltages of below 100 volts are realizable.

SUMMARY AND OBJECT OF THE INVENTION

The invention is based on the object of further increasing the ionization of the plasma in the surroundings of a sputter cathode.

The advantage achieved with the invention resides in that a very low discharge voltage can be used in sputtering apparatus. Moreover, through provision of an additional magnetic field in front of the sputter cathode, the distribution of the plasma can be influenced within a broad range. It can, for example, cooperate with a normal magnetron field of different strength so that for the electron gas interaction an ECR condition is created, or it is possible to work with a weak field when no ECR condition is present.

By superposition of the additional static magnetic field or ac magnetic field, the microwave plasma interaction is increased. The magnetic field is oriented so that the magnetic field lines extend perpendicularly toward the target.

BRIEF DESCRIPTION OF THE DRAWINGS

An embodiment of the invention is depicted in the drawings, wherein.

DETAILED DESCRIPTION OF THE EMBODIMENT

Figure 1:
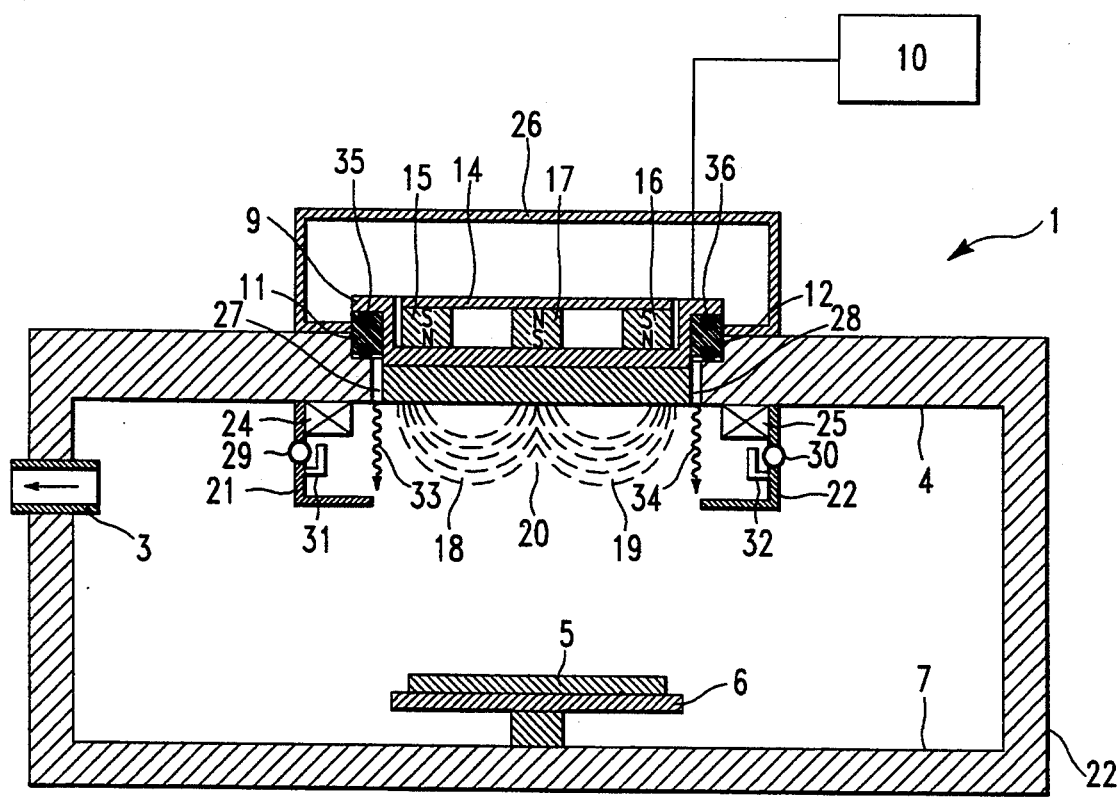
FIG. 1 is a schematic cross-sectional view of a plasma chamber with a magnetron cathode and microwave irradiation means.

In FIG. 1 there is depicted a plasma chamber 1 whose housing 2 comprises a gas outlet 3 connected to a vacuum pump (not shown). In the housing 2 comprising special steel there is disposed a substrate 5 to be coated or etched. The substrate 5 is disposed on a rotary table 6 disposed on the bottom 7 of the housing 2. Opposing the substrate 5 and integrated in the upper wall 4 of the housing 2 is a sputter electrode 8 which is connected with a cathode 9. A power supply 10, which is preferably a dc current supply, is connected to the cathode 9. The cathode 9 is seated on electrical insulators 11, 12 which, in turn, are embedded in a recess of the upper wall 4 of the housing 2 and in each instance carry a sealing ring 35, 36.

In the cathode 9 there are provided three permanent magnets 15, 16, 17 with one north pole and one south pole each, wherein these permanent magnets 15, 16, 17 are connected with one another via a yoke 14. Field lines 18, 19 of the permanent magnets 15 to 17 penetrate through the cathode 9 and the target 8 and form two arches in the plasma volume 20.

This plasma volume 20 is delimited laterally by two angle brackets or shielding sheets 21, 22 comprising copper, which abut the inside of the upper wall 4. In the plasma volume 20 and between the upper wall 4 and the shielding sheets 21, 22 there is disposed a coil which generates a magnetic field perpendicular to the target 8. The coil comprises two coil halves 24, 25 which, in a manner not shown, are connected with one another. With the largely homogeneous magnetic field of coils 24, 25 three effects are essentially achieved. First, through an effective interaction of the electrons with the microwaves an additional plasma activation is achieved. Second, through the magnetic field the plasma in front of the target of the sputter electrode 8 is made uniform so that a better target utilization results. Third, through the magnetic field the plasma is extended more strongly in the direction toward the substrate, which has a favorable influence on the growth of the layer.

On the outside of housing 2 there is provided a waveguide 26 which surrounds the magnetron cathode comprising the magnets 15 to 17, the yoke 14, and the cathode 9. This waveguide 26 has the form of a right-angled pipe and is tuned to resonance. Into this waveguide 26 are introduced microwaves, and specifically perpendicularly to the plane of the drawing. Further details about the introduction of the microwaves are evident in FIG. 2.

The microwaves pass via the insulators 11, 12 which can comprise, for example Teflon, as well as via gaps 27, 28 into the plasma volume 20. There they generate in combination with the magnetic fields 18, 19 of the permanent magnets 15 to 17 and the magnetic field of the additional magnet 24, 25 an electron cyclotron resonance of a gas streaming from feed pipes 29, 30. The positively charged particles in the plasma volume 20 impinge at high speed on the target 8 and eject particles from it which are deposited on the substrate 5. So that the feed pipes 29, 30 are not sputtered closed in the course of time, shield angles 31, 32 are provided.

The microwaves entering the plasma volume 20 are depicted symbolically and provided with the reference numbers 33, 34. For coupling the microwave through the slits or the dark spaces 27, 28 into the plasma volume 20, no complicated devices are required. A standard sputtering electrode configuration is entirely sufficient. Over the atmosphere side of the cathode 9 a microwave resonator box 26 is placed from which the microwaves are guided into the plasma via the dark spaces 27, 28. The insulators 11, 12 comprising Teflon also have a vacuum sealing function for which reason on both sides of the insulators 11, 12 O-rings 35, 36 are provided as sealing rings.

Figure 2:
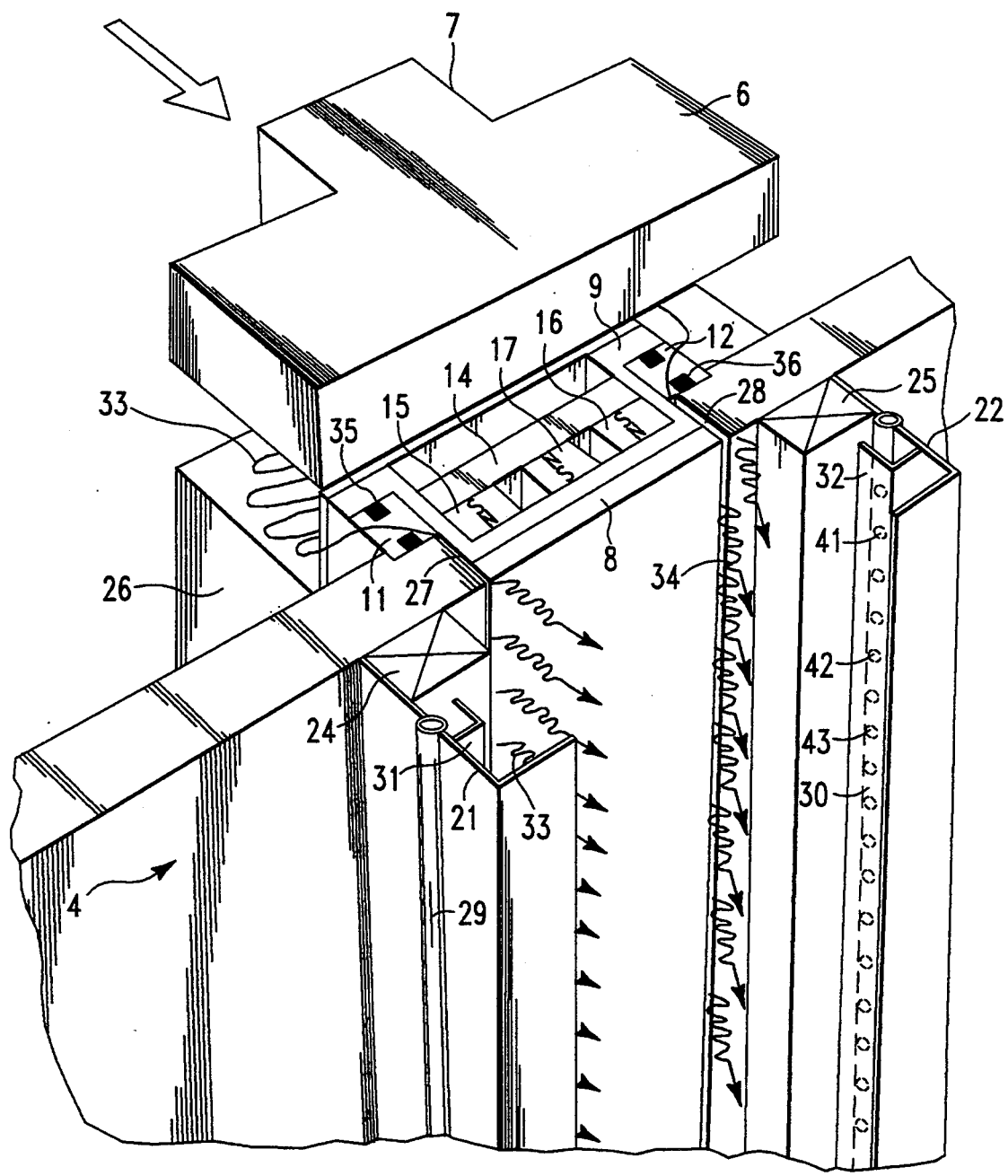
FIG. 2 is a perspective sectional representation of the microwave irradiation and of the plasma volume directly in front of the magnetron cathode.

In FIG. 2 the device according to FIG. 1 is depicted in a partial perspective view. It is evident that the microwaves are introduced via an extension 40 into the cavity resonator 26 which is here shown in a cut view in order to ensure the view into the magnetron. The gas feed lines 29, 30 comprise numerous holes directed to the plasma volume 20, of which only three are provided with the reference numbers 41, 42, 43. In front of these holes 41 to 43 the shield angles 31, 32 are provided which serve the function of preventing that the holes are closed through the sputtering. If ac current flows through the coils 24, 25, the plasma in front of the cathode 9 can be made to pulsate. Furthermore, the plasma in front of the target 8 oscillates slightly back and forth so that a higher target utilization results.

Through the shielding sheets 21, 22 the cavity resonator is divided into an upper and a lower cavity resonator. The lower resonator is a ring resonator along the Teflon seals 11, 12 with a connection to the upper resonator on the side opposing the microwave inlet. From the lower resonator the microwave passes via the dark spaces 27, 28 to the plasma. The upper resonator functions as a buffer resonator. Because of the structure of the resonator there is achieved a marked uniformity of the field in the dark space along the cathode side.

It is understood that in FIGS. 1 and 2 only one of several possible embodiments is depicted. Instead of a rotary table 6 there can also be provided a linearly movable substrate carrier, such as is preferably used in conventional in-line installations.

We claim:

1. A device for generating a plasma by means of cathode sputtering and microwave irradiation, comprising
   a) a plasma chamber;
   b) a sputtering target in the plasma chamber connected via an electrode to a power supply;
   c) a magnetron magnet structure positioned behind the sputtering target whose magnetic field exits from the target and again enters it;
   d) a microwave transmitter which transmits microwaves via a waveguide into the region in front of the target, whereat parallel shielding sheets are provided opposite the target surface; and
   e) a magnet provided on the shielding sheets for generating a field which extends essentially perpendicular to the target.

2. A device as in claim 1, wherein the magnet is an electromagnet comprising a coil wound around the inner space defined by said shielding sheets.

3. A device as in claim 1, wherein the magnet is a dc magnet.

4. A device as in claim 1, wherein the magnet is an ac magnet.

5. A device as in claim 1, wherein the plasma chamber is disposed in a housing on whose outside is disposed the waveguide connected with the plasma volume via microwave-permeable seals and at least one gap.

6. A device as in claim 5, wherein the seals comprise Teflon elements each with a sealing ring.

7. A device as in claim 6, wherein the Teflon elements function as a lower resonator.

8. A device as in claim 1, wherein the shielding sheets comprise integrated gas feed lines which comprise a plurality of holes directed into the plasma volume.

9. A device as in claim 1, wherein the shielding sheets comprise gas feed lines surrounded by shield angles.

* * * * *